United States Patent
Anderson et al.

(10) Patent No.: US 12,019,126 B2
(45) Date of Patent: Jun. 25, 2024

(54) SUBSTITUTIONARY PORTABLE CALIBRATION DEVICE METHOD FOR CORRECTION OF MAGNETOMETER OF ACCESS POINT

(71) Applicant: Cisco Technology, Inc., San Jose, CA (US)

(72) Inventors: Fred Jay Anderson, Lakeville, OH (US); John Matthew Swartz, Lithia, FL (US); Jerome Henry, Pittsboro, NC (US); Robert Edgar Barton, Richmond (CA); Matthew Aaron Silverman, Shaker Heights, OH (US); Michael F. Marlborough, Fairlawn, OH (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/977,282

(22) Filed: Oct. 31, 2022

(65) Prior Publication Data

US 2024/0142547 A1 May 2, 2024

(51) Int. Cl.
*G01R 33/00* (2006.01)

(52) U.S. Cl.
CPC ..... *G01R 33/0023* (2013.01); *G01R 33/0047* (2013.01)

(58) Field of Classification Search
CPC .......................... G01R 33/0023; G01R 33/0047
USPC ........................................................ 324/244
See application file for complete search history.

(56) References Cited

U.S. PATENT DOCUMENTS

| | | | | |
|---|---|---|---|---|
| 7,275,008 B2* | 9/2007 | Plyvanainen | .......... | G01C 25/00 702/92 |
| 7,891,103 B2* | 2/2011 | Mayor | .................. | G01R 33/10 33/356 |
| 2005/0262714 A1* | 12/2005 | Schierbeek | ............ | G01C 17/38 33/356 |
| 2007/0156337 A1* | 7/2007 | Yanni | ...................... | G01S 19/49 701/469 |
| 2010/0312509 A1* | 12/2010 | Patel | ...................... | G01C 17/38 702/92 |
| 2010/0312513 A1* | 12/2010 | Mayor | ............... | G01R 33/0035 702/92 |
| 2012/0086438 A1* | 4/2012 | Tu | ........................ | G01R 33/028 324/202 |
| 2012/0157158 A1* | 6/2012 | Mayor | .................. | G01V 3/087 455/556.1 |
| 2013/0320966 A1 | 12/2013 | Oliver et al. | | |
| 2013/0337945 A1 | 12/2013 | Marks et al. | | |

(Continued)

FOREIGN PATENT DOCUMENTS

CN 108267113 A 7/2018

*Primary Examiner* — Christopher P McAndrew
(74) *Attorney, Agent, or Firm* — Edell, Shapiro & Finnan, LLC

(57) ABSTRACT

A method for calibrating a magnetometer of a device is provided. The method includes collecting, with a portable calibration device having a magnetometer, magnetic field measurements in a spatial region about a mounting location where the device is to be installed for operation, estimating magnetometer compensation parameters to correct for magnetic field distortion at the mounting location based on the magnetic field measurements collected by the portable calibration device, and configuring the device installed at the mounting location based on the magnetometer compensation parameters.

22 Claims, 13 Drawing Sheets

(56) References Cited

U.S. PATENT DOCUMENTS

2016/0007270 A1    1/2016   Maor
2018/0332557 A1   11/2018   Vuronos et al.

* cited by examiner

WAVE THE PHONE
IN A FIGURE 8 MOTION TO CALIBRATE

SUBSTITUTIONARY PORTABLE CALIBRATION DEVICE METHOD FOR CORRECTION OF MAGNETOMETER OF ACCESS POINT

TECHNICAL FIELD

The present disclosure relates to calibration of a magnetometer device to account for magnetic distortion at a location where the device will be installed and operated.

BACKGROUND

A magnetometer is a sensor used to measure the strength and direction of a magnetic field and can be used to determine the heading with respect to magnetic North. In most real-world applications, the magnetic field measured is a combination of the Earth's magnetic field as well as the magnetic fields and disturbances created by nearby ferrous objects (e.g., I-beams, etc.). In order to obtain an accurate heading, it is desirable to mitigate the distortion created by these nearby ferrous objects, and this is done using Hard-Iron and Soft-Iron calibration.

Hard-Iron distortion is produced by materials, such as a permanent magnet, which exhibits a constant additive field to the earth's magnetic field. This generates a constant additive value to the output of each magnetometer axis. Hard Iron calibration involves subtracting a set of offsets to each of the three axes to correct for the Hard-Iron distortion.

Soft-Iron distortion is produced by materials (e.g., nickel and iron) that influences or distorts a magnetic field but do not generate a magnetic field. This type of distortion is not additive (as in the case of Hard-Iron distortion), and the distortion produced by Soft-Iron materials is dependent upon the orientation of the material relative to the magnetometer and the magnetic field. Soft-Iron calibration involves multiplying a set of scale factors to each of the three axes to correct for the Soft-Iron distortion.

DETAILED DESCRIPTION

Overview

According to an aspect of the present disclosure, a method for calibrating a magnetometer of a device is provided. The method includes collecting, with a portable calibration device having a magnetometer, magnetic field measurements in a spatial region about a mounting location where the device is to be installed for operation, and estimating magnetometer compensation parameters to correct for magnetic field distortion at the mounting location based on the magnetic field measurements collected by the portable calibration device. The method further includes configuring the device installed at the mounting location based on the magnetometer compensation parameters.

Example Embodiments

Figure 1:
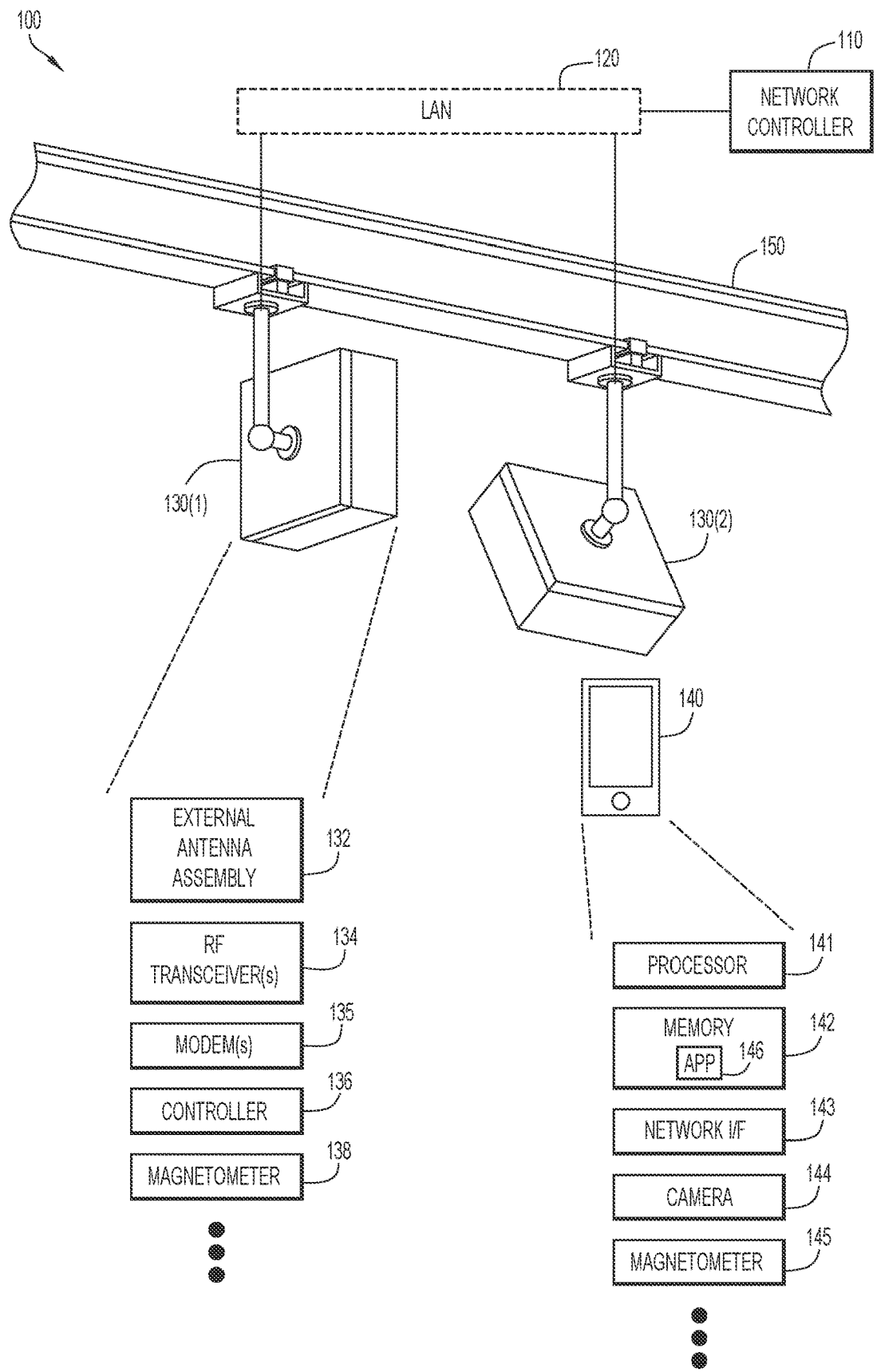
FIG. 1 is a diagram of a system including access points for an installation in a large public venue and a portable calibration device used to derive magnetic field measurements about installation locations of the access points, according to an example embodiment.

Referring now to FIG. 1, a system 100 is shown that is configured to calibrate a magnetometer of an access point to account for magnetic distortion at a location where the access point will be installed for operation. The system 100 includes a network controller 110 that is in communication with one or more access points through a network 120 (e.g., a local area network (LAN)). The network 120 may also include connections to other networks (e.g., Wide Area Networks, internet, intranet, etc.). The system 100 also includes access points (APs) 130(1), 130(2), etc., each of which is configured to wirelessly connect wireless client devices (not shown) to the network 120. Additionally, the system 100 includes a portable calibration device 140 (e.g., a smartphone or other similar portable electronic device), which may also be in communication with the network controller 110 through the network 120 or another network, such as wireless wide area network (WWAN)/cellular network.

As shown in FIG. 1, the AP 130(1) includes an external antenna assembly 132 including one or more antennas configured to transmit and receive wireless signals to and from wireless devices, one or more radio frequency (RF) transceiver(s) 134, one or more modem(s) 135, a controller 136 (e.g., processor, micro-processor), and a magnetometer 138, among other possible components. The AP 130(1) is in communication with the network controller 110 via the network 120, such as through a wired network (Ethernet) cable connection.

As also shown in FIG. 1, the portable calibration device 140 includes, among other possible components, a processor 141 to process instructions (e.g., an application or program), a memory 142 to store the instructions and a variety of data (e.g., magnetic measurements, calibration parameters, etc.), a network interface unit 143 to communicate with other electronic devices (e.g., network controller 110, APs 130(1), AP 130(2), etc., and/or networks (e.g., network 120), a camera 144 to captures images, and a magnetometer 145. The memory 142 may comprise read only memory (ROM), random access memory (RAM), magnetic disk storage media devices, optical storage media devices, flash memory devices. The processor 141 may comprise, for example, a microprocessor or microcontroller that executes instructions for implementing the processes described herein. Thus, in general, the memory 142 may comprise one or more tangible (non-transitory) computer readable storage media (e.g., a memory device) encoded with software comprising computer executable instructions and when the software is executed (by the processor 141) it is operable to perform the operations described herein. For example, the memory 142 stores instructions for a calibration application (App) 146.

Generally, a minimal method for calibrating magnetometers at the point of installation involves a three-dimensional (3D) rotation of the unit ("FIG. 8" calibration) while the electronic device is powered up and running. However, this technique is not practical to do for access points with external antennas (e.g., due to their size/weight, mounting locations, safety of the installer, etc.), such as the AP 130(1) of FIG. 1.

In particular, FIG. 1 highlights the challenges that are involved in calibrating the on-board magnetometer 138 at the point of installation of the AP 130(1). For example, there may be steel I-beam(s) 150 in direct proximity to the AP 130(1), distorting magnetometer readings. The AP's mounting location may be overhead, high above the floor. In some cases, a technician cannot directly calibrate the magnetometer 138 of an AP 130(1) for various reasons (e.g., AP is not installed or powered yet, the AP is too large/bulky/heavy to "FIG. 8" calibrate, the AP does not provide any feedback indicating whether or not magnetometer calibration was successful, etc.).

Accordingly, the embodiments presented herein overcome these drawbacks by utilizing the portable calibration device 140 and/or the network controller 110 to perform certain operations in the manner described herein on behalf of an AP, e.g., the AP 130(1), AP 130(2), etc. Rather than directly calibrating the magnetometer 138 in the AP itself, the techniques presented herein involve performing a proxy calibration method whereby: (1) a 3D "FIG. 8" calibration of magnetometer 145 in portable calibration device 140 (e.g., smartphone or other portable hand-held device) is performed at the point of install for the AP; (2) the calibration application (App) 146 in the portable calibration device 140 transfers the measurements obtained from the magnetometer 145 in the portable calibration device 140 to the wireless network controller 110 (or possibly another remote computing device); and (3) the network controller 110 can then compute and apply magnetometer compensation to the AP.

Next, various steps of a proxy calibration method for calibration of a magnetometer in a target device (e.g., an access point having an external antenna) using a portable calibration device (e.g., a smartphone or similar mobile device) will be described with reference to FIGS. 2A-2F. Reference is also made to FIG. 1 for purposes of the description of FIGS. 2A-2F.

Figure 2A:
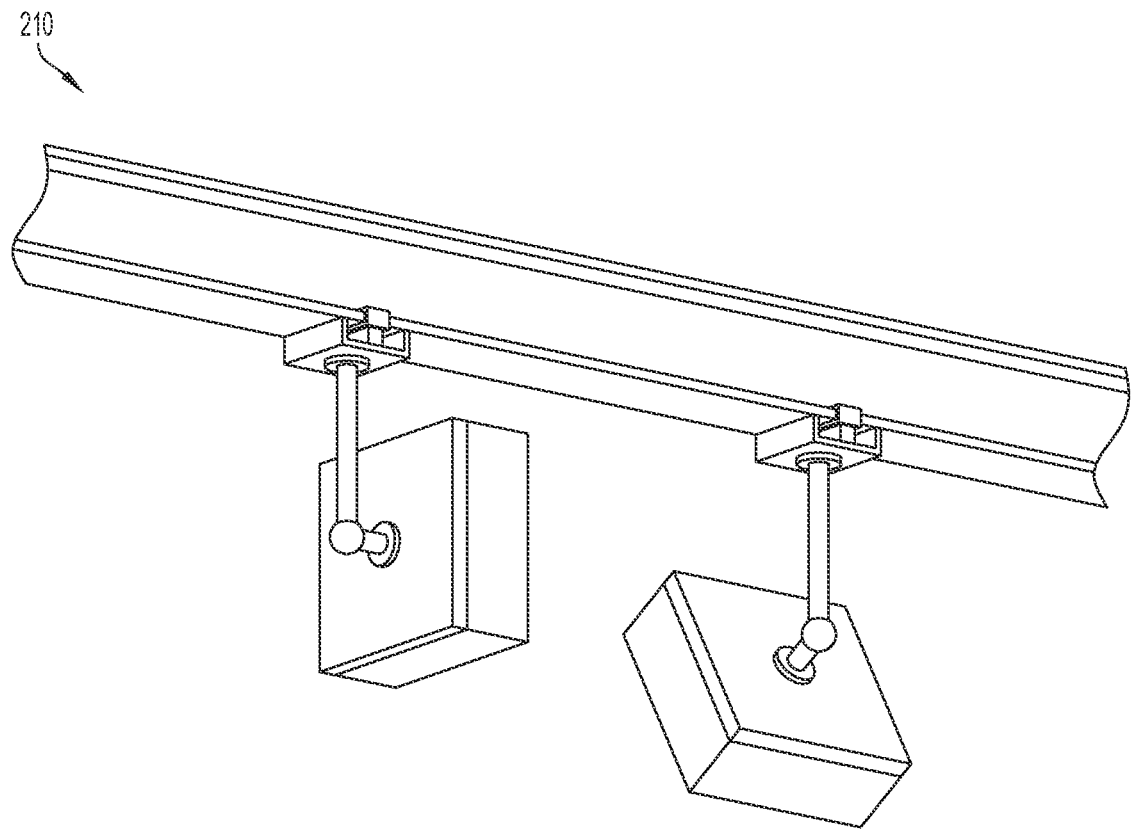
FIGS. 2A-2F show various steps of a proxy calibration method for calibration of a magnetometer in a target device (e.g., an access point having an external antenna) using a portable calibration device (e.g., a smartphone or similar mobile device), according to an example embodiment.
Figure 2A:
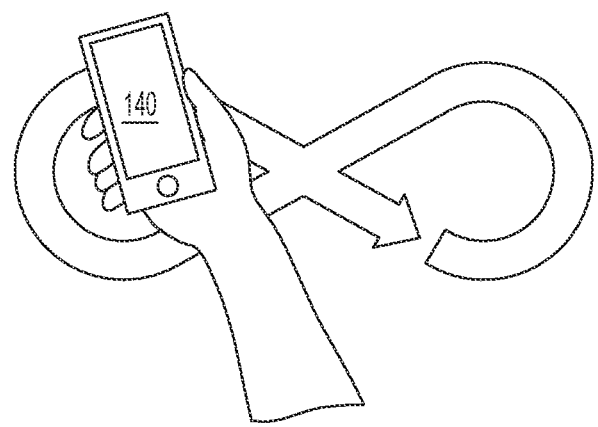

As shown in FIG. 2A, a pre-installation procedure is performed at step 210. Before installation of an AP, a portable calibration device 140 with a calibration application 146 can measure magnetic field distortion and theses magnetic field measurements can be used to calculate calibration parameters (also referred to herein as compensation parameters). In some example embodiments, the portable calibration device 140 may output a user instruction to perform a particular calibration movement (e.g., "Wave the phone in a FIG. 8 motion to calibrate") at the mounting location of the AP. Measuring the magnetic field distortion using the FIG. 8 motion can be repeated once or several times.

Figure 2B:
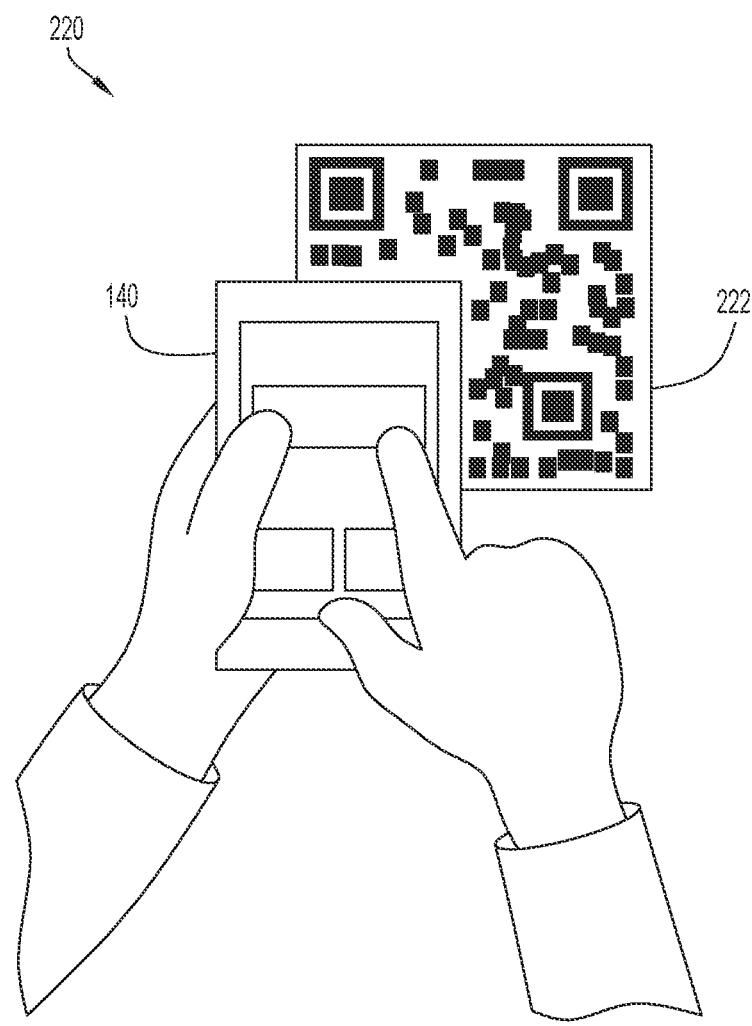

At step 220, a user of the portable calibration device 140 (e.g., the installer of the AP) scans a bar code label 222 (e.g., a QR code) of the AP to correlate each calibration session to an individual AP (e.g., AP 130(1), AP 130(2), etc.), as shown in FIG. 2B. The scanning operation can be performed using the camera 144 of the portable calibration device 140 to capture an image of the bar code label or QR code, for example.

Figure 2C:
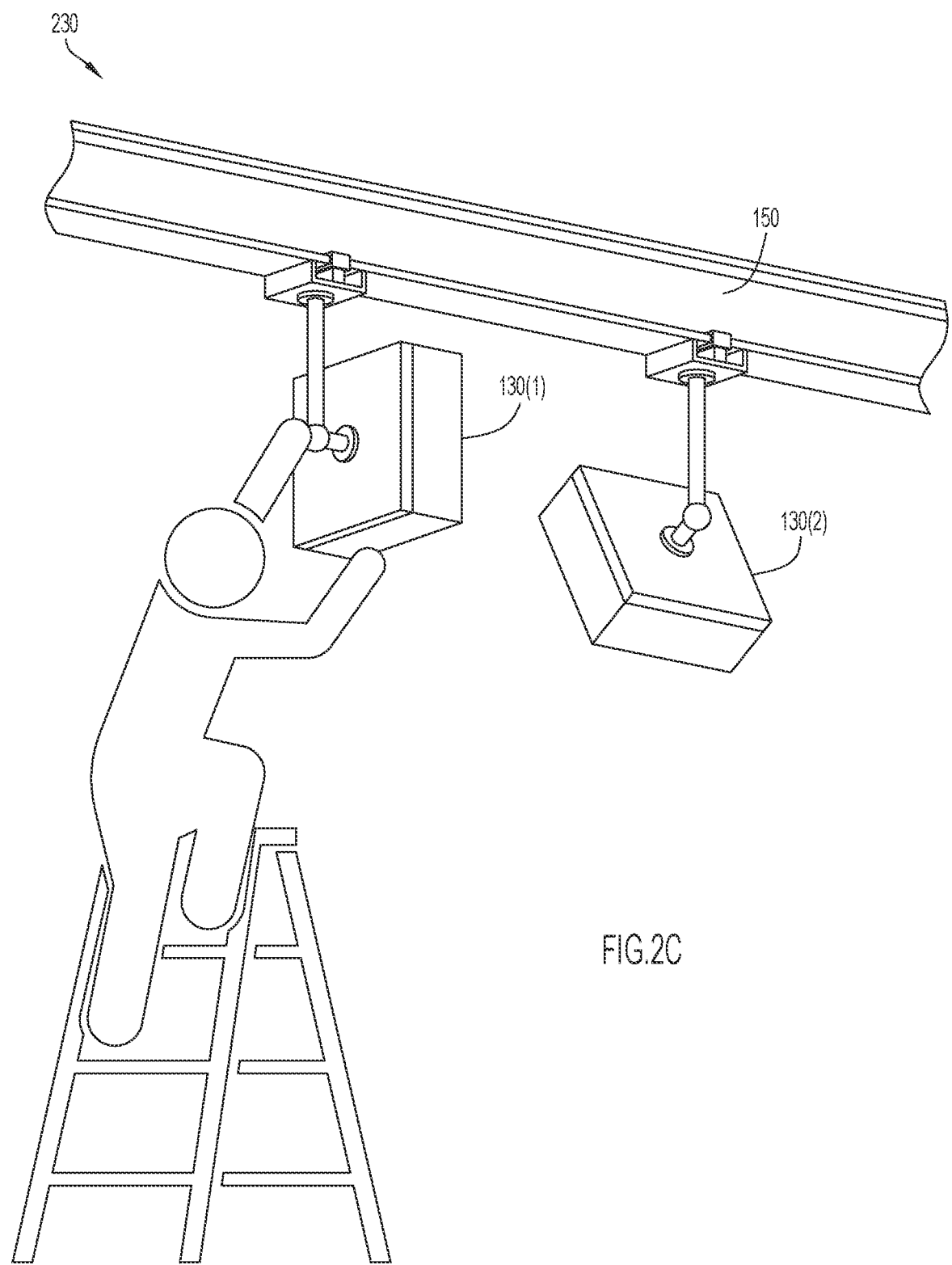

The user (the installer) then mounts the AP at the point of installation, at step 230, as shown in FIG. 2C. Step 230 may be performed in a different order in some other example embodiments (e.g., when an AP is already installed at the mounting location, step 230 may come before step 210).

Figure 2D:
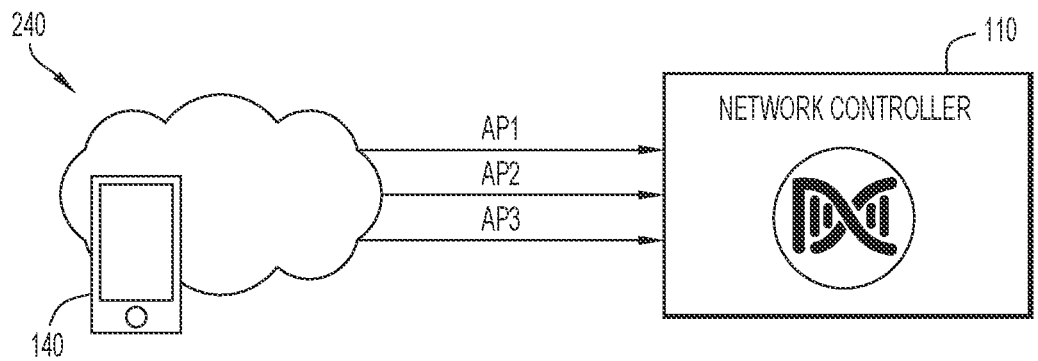
Figure 2E:
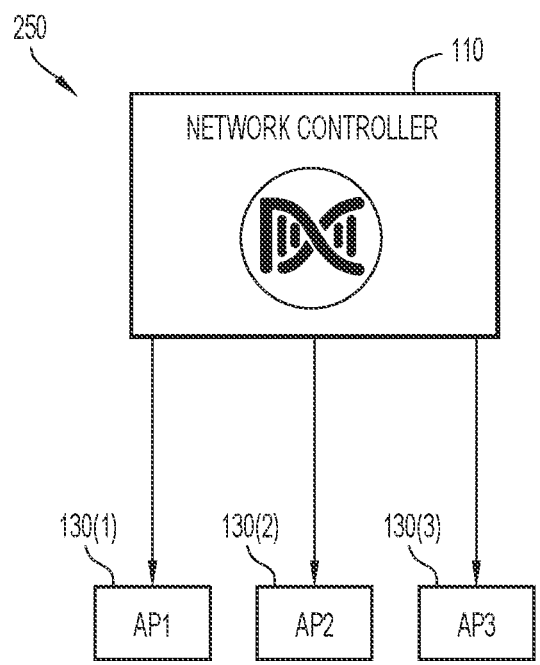

Next, as shown at step 240 in FIG. 2D, the calibration application 146 of the portable calibration device 140 (e.g., smartphone App) sends magnetic field measurement data for each AP (e.g., AP 130(1), AP 130(2), etc.) to the network controller 110. The network controller 110 may then compute magnetometer calibration parameters for each AP. Further details on the computations performed to generate the calibration parameters are described below in connection with FIGS. 3A-3D, 4 and 5. Then, as shown in FIG. 2E, at step 250, the network controller 110 configures each AP (e.g., AP 130(1), AP 130(2), etc.) with respective magnetometer calibration parameters to correct for magnetic field distortions in proximity to each respective AP.

Figure 2F:
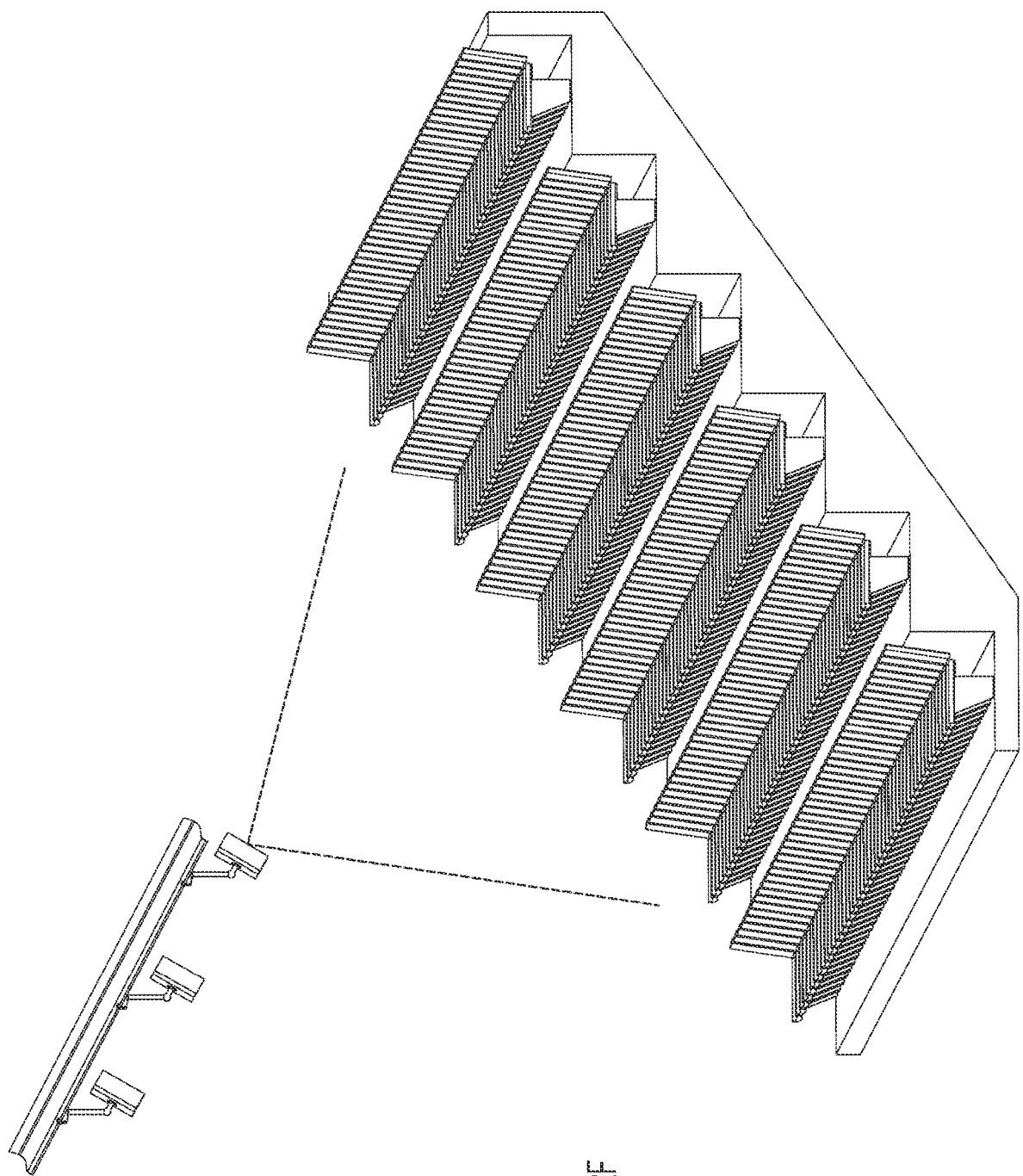

In the example shown in FIG. 2F, the antenna 132 is tilted towards the middle of the tier, and covers (with −50 dBm) the seating area. With the magnetometers of the APs calibrated in this manner, a coverage area within the large public venue (e.g., stadium) can be accurately predicted, and if necessary, live directional adjustments may be made with respect to one or more antenna(s) 132 of one or more target device(s) (e.g., AP 130(1), AP 130(2), etc.) via a network controller 110 connection to the calibration application 146 of the portable calibration device 140 (e.g., smartphone App), at step 260, as shown in FIG. 2F. Coordination between the devices can be performed in various ways. For example, the target device (AP) can either be selected on the network controller 110 manually (e.g., by name, etc.) or the calibration application 146 can identify the target device automatically (e.g., by determining the location of the portable calibration device 140 and referencing that against a database of the known locations of the APs). In another example, the installer could use the camera 144 of the portable calibration device 140 to detect a specific pattern of the LEDs blinking that is unique to each target device (AP). The results from calibrating a specific target device can be shared back to the network controller 110 directly from the portable calibration device 140 over a network connection and pairing of the portable calibration device 140 with the network controller 110 (e.g., via login, etc.). Thus, the prediction of coverage area and directional adjustments can be performed per AP, and may be controlled by the network controller 110 for various APs throughout the large public venue, via coordination with the calibration application 146.

Referring back to FIG. 1, once a given target device (e.g., AP 130(1), 130(2), etc.) is configured with the compensation parameters to correct for magnetic field distortion, that target device can accurately determine the coverage area of its antenna 132 because the target device can better know its orientation determined by its magnetometer (adjusted by the compensation parameters). The target device can determine whether its antenna 132 provides coverage of an entire target area (or slightly imperfect coverage within a tolerance range), or provides incomplete/insufficient coverage of the target area due to the magnetic field distortion near the mounting location. In the case of incomplete/insufficient coverage of a given target area, this magnetometer calibration also enables the target device to adjust the radiation pattern of its antenna 132 accordingly, in order to improve/increase the antenna's coverage of the target area (i.e., cover the missed portion of the target area). For example, adjusting the radiation pattern may include directional adjustments and/or size/width adjustments of the antenna beam (and hence, coverage area).

Once the network controller 110 receives the magnetometer compensation parameters from the portable calibration device 140, or receives the magnetic field measurements from the portable calibration device 140 and calculates the magnetometer compensation parameters for each target device (e.g., AP 130(1), AP 130(2), etc.) in the large public venue and configures each target device in the large public venue with the magnetometer compensation parameters, the network controller 110 can accurately determine coverage of all target areas in the entire large public venue. Some target devices may be subject to a tolerable amount of magnetic field distortion (AP/antenna provides slightly imperfect but still acceptable coverage of the target area—no antenna adjustment needed), while other target devices may be affected by a more substantial amount of magnetic field distortion (AP/antenna provides incomplete/insufficient coverage of target area—antenna adjustment needed). The network controller 110 can make this distinction to determine whether any target devices (and which target devices) miss some non-negligible portion of their respective target areas, and need to have their antenna radiation patterns adjusted in order to account for the magnetic field distortion and provide more complete coverage of the target areas throughout the large public venue. In the case of incomplete/insufficient coverage of one or more target areas in the large public venue, this magnetometer calibration also enables the network controller 110 to control one or more respective target devices to adjust the radiation pattern of their respective antennas 132 accordingly, in order to improve/increase the overall coverage of all of the target areas (i.e., cover the missed portions of the respective target areas). For example, adjusting the radiation pattern may include directional adjustments and/or size/width adjustments of the one or more antennas' respective beams (and hence, respective coverage areas). In some example embodiments, the directional adjustments can be made to the antenna of the target device that is being affected by magnetic field distortion and does not provide full coverage of a given target area. Additionally or alternatively, directional adjustments could be made to an antenna of another adjacent target device to provide better coverage for the missed portion of the target area, in some other example embodiments.

Currently, the manual process to install and orient APs such that their antennas point in various directions to cover an entire area in a large public venue is cumbersome and error prone. The installer, or often a person other than the installer, inputs information relating to the AP and its antenna (e.g., height, where it is aimed, orientation, degrees of tilt (downward angle, left/right angle), etc. However, translating this information from 3D space onto a 2D map is problematic. Therefore, an additional advantage of the magnetometer calibration process described herein is that it allows each target device to accurately determine its own height and orientation (direction, tilt) and the network controller can accurately determine the heights and orientations of all of the target devices throughout the large public venue.

This effectively automates part of the manual process and removes the need for the installer or another person to record the antenna information in a map of the large public venue as well as avoiding the potential inaccuracy of manual entry in the map.

Reference is now made to FIGS. 3A-3E for a description of the computations made to generate magnetometer calibration compensation parameters.

Figure 3A:
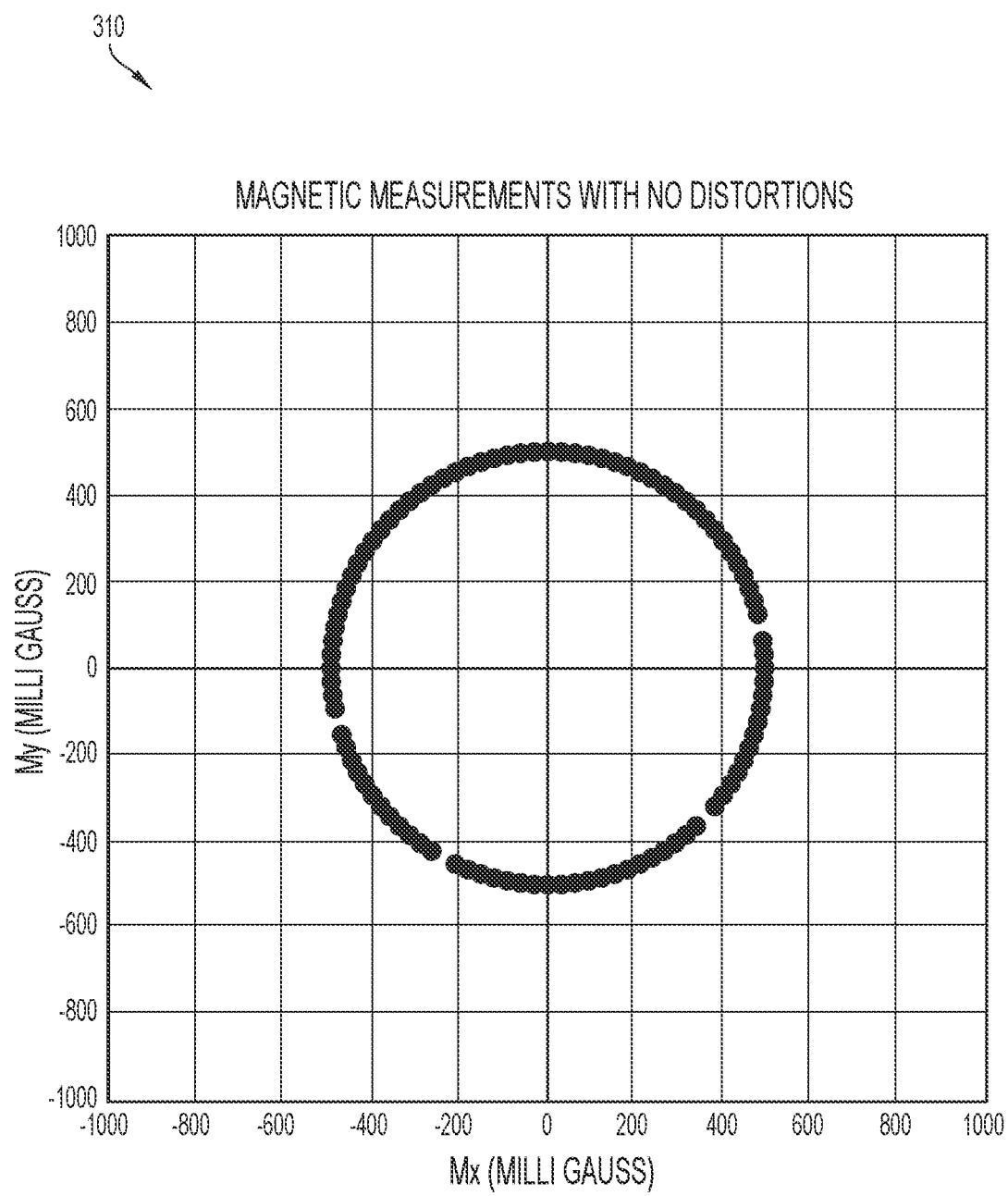
FIG. 3A is a graphical plot showing a two-dimensional representation of measurements taken by a magnetometer with no distortion (with the output of the magnetometer rotated about the Z-axis).
Figure 3B:
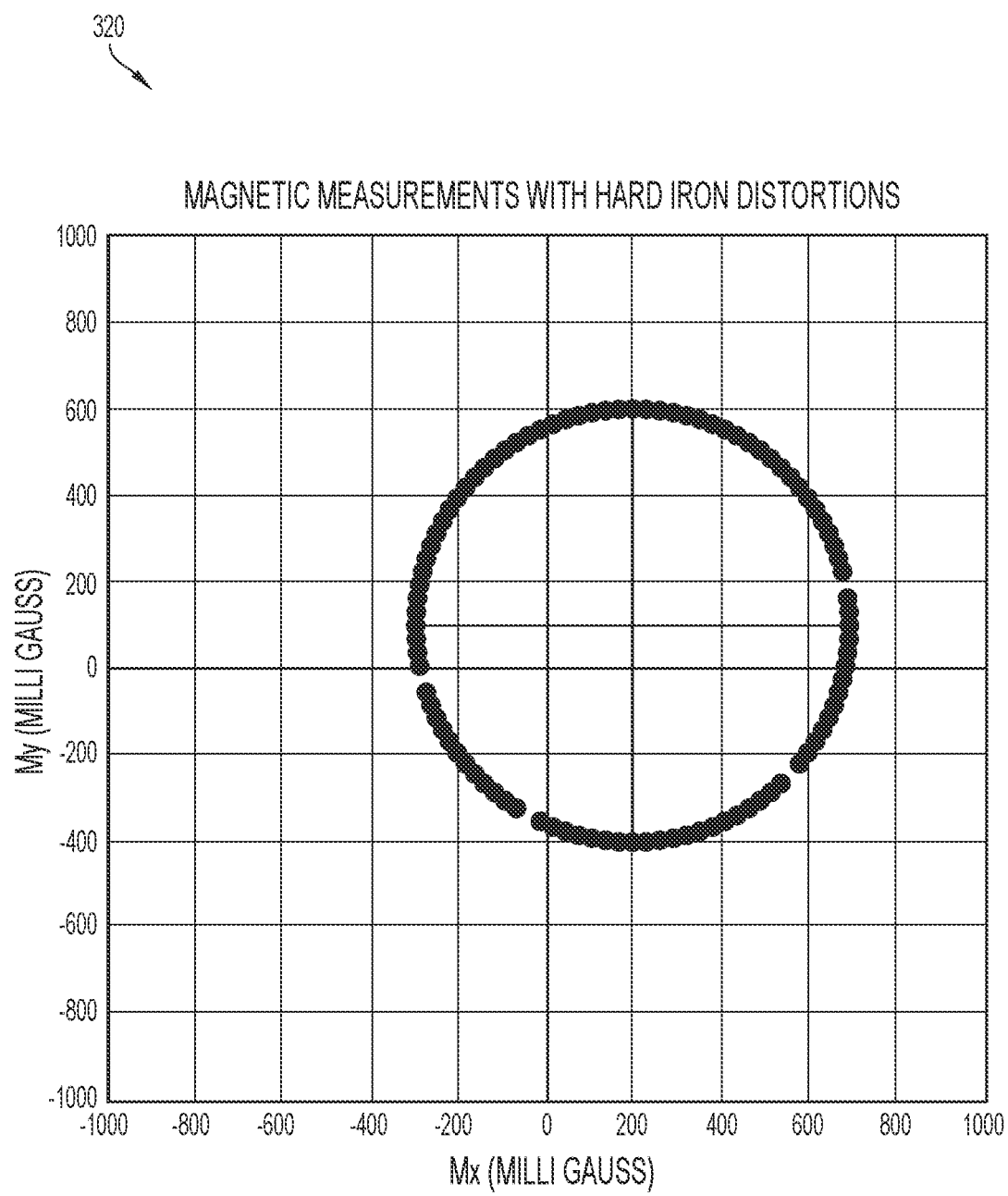
FIG. 3B is a graphical plot showing a two-dimensional representation of measurements taken by a magnetometer and illustrating the impact of hard-iron distortion.
Figure 3C:
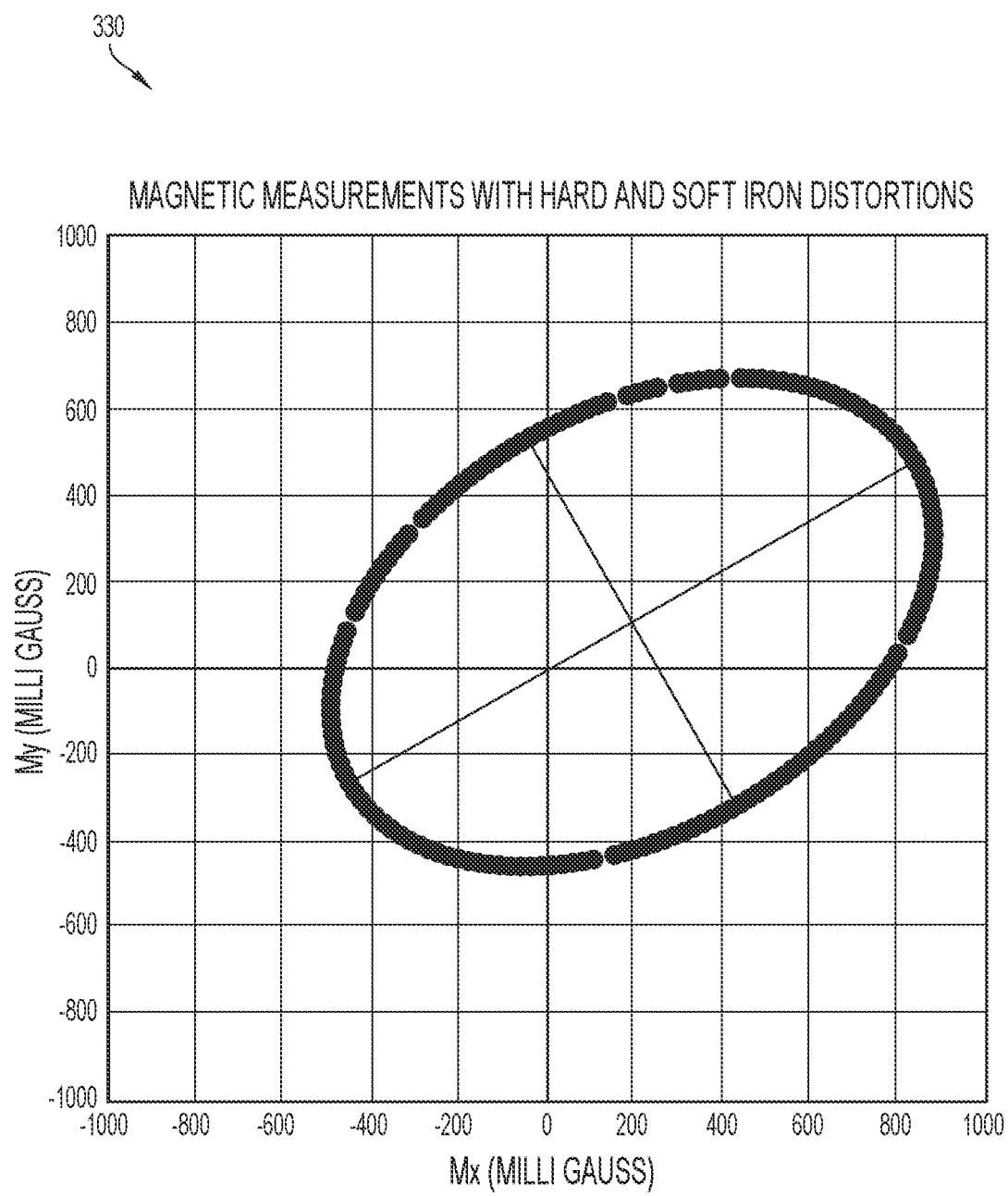
FIG. 3C is a graphical plot showing a two-dimensional representation of measurements taken by a magnetometer and illustrating the impact of both hard-iron distortion and soft-iron distortion.

The graphical plots shown in FIGS. 3A-3C illustrate two-dimensional (2D) representations of measurements taken by a magnetometer, and the impact of hard-iron and soft-iron distortions.

FIG. 3A is a graphical plot 310 showing a two-dimensional representation of measurements taken by a magnetometer (with the output of the magnetometer rotated about the Z-axis) with no distortion present (no hard-iron or soft-iron distortion). This would form a sphere centered at the origin in a three-dimensional (3D) case.

FIG. 3B is a graphical plot 320 showing a two-dimensional representation of measurements taken by a magnetometer and illustrating the impact of hard-iron distortion. Hard-iron distortion will cause a permanent bias to be present on the magnetometer measurements, due to the constant additive field, which shifts the center of the circle. This would form a sphere with the center shifted from the origin in a 3D case.

FIG. 3C is a graphical plot 330 showing a two-dimensional representation of measurements taken by a magnetometer and illustrating the combined impact of both hard-iron distortion and soft-iron distortion. Soft-iron distortion will distort and warp the magnetic field into an elliptical shape. This would form an ellipsoid with the center shifted from the origin in a 3D case.

Thus, it is well known that magnetometers, needle compasses, etc. are susceptible to hard-iron and soft-iron effects which locally distort the uniform magnetic field of the Earth, and thereby distort heading/orientation measurements (e.g., since APs are sometimes located near large metal surfaces, e.g., I-beams, etc.). Accordingly, performing calibration of the magnetometer of the AP at the point of install can overcome these distortions of the magnetometer's approximation of heading, especially distortions caused by iron/steel building structure, poles, conduits, etc. located near the AP.

Figure 3E:
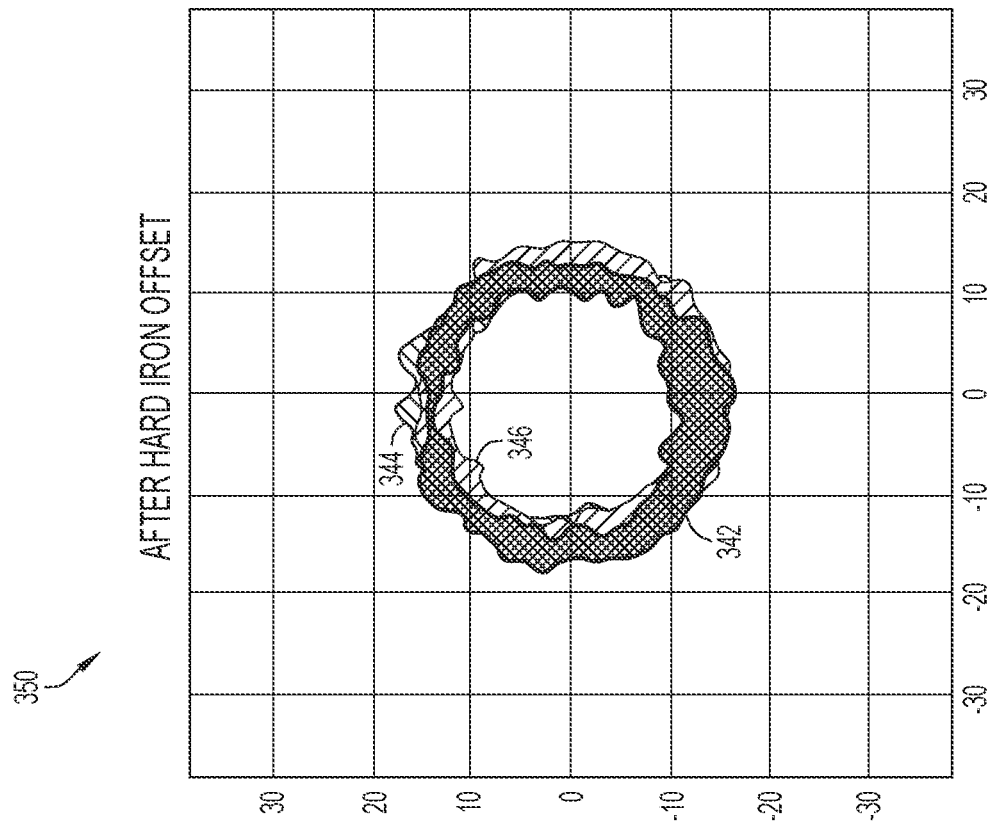
FIG. 3E is a plot illustrating magnetometer output after hard-iron offset calibration using the techniques presented herein, according to an example embodiment.
Figure 3D:
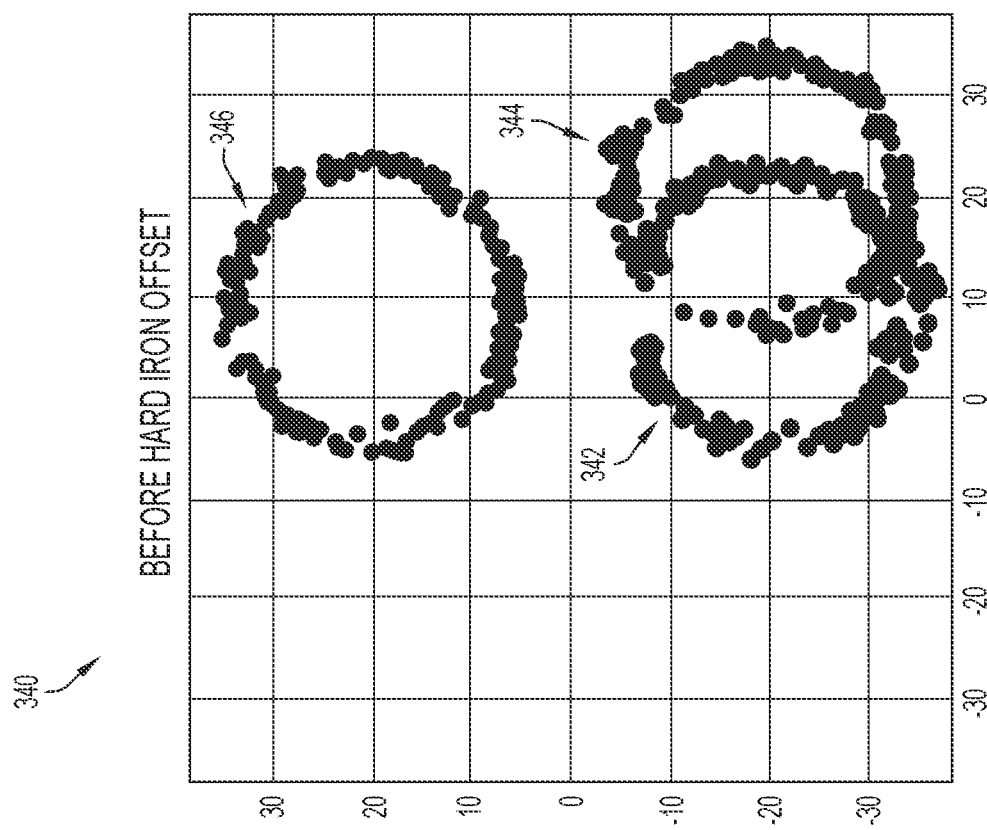
FIG. 3D is a plot illustrating magnetometer output before hard-iron offset calibration.

FIG. 3D shows a plot 340 illustrating magnetometer output before hard-iron offset calibration. FIG. 3E illustrates a plot 350 that shows magnetometer output after hard-iron calibration of the magnetometer. It is possible to compensate for the effects of both hard-iron and soft-iron distortion on the magnetometer through the use of hard-iron and soft-iron calibration of the magnetometer, which will map the biased and distorted ellipsoid back into a sphere that is centered at the origin. This is typically done by a full 3D calibration that rotates the magnetometer measurements as much as possible about all axes ("FIG. 8" rotation) to cover a sphere of measurement. In FIG. 3D, the plot 340 includes three sets of data points corresponding to magnetometer measurements 342 (rotation around the x-axis), magnetometer measurements 344 (rotation around the y-axis), and magnetometer measurements 346 (rotation around the z-axis). The hard-iron compensation parameters are then estimated from the magnetometer measurements 342, 344 and 346, respectively. In FIG. 3E, the plot 350 includes the three sets of data points corresponding to magnetometer measurements 342, 344, and 346 of FIG. 3D, to which different hard iron offsets (compensation parameters) are applied in order to shift and recenter each shape corresponding to the sets of data points with respect to the origin (0, 0) in the graph.

Since the magnetic field of the Earth is relatively constant, the magnitude of the magnetic field measured by the magnetometer should also be constant, regardless of the orientation of the magnetometer (sensor). If one were to rotate the sensor around and plot mx, my, and mz in 3D, the paths should plot out the surface of a sphere with uniform radius. Alternatively, the three rotational plots defined by those three axes should have zero offset with respect to each other. In order to collect data corresponding to offsets from nearby hard iron/soft iron magnetic field influencers, the magnetometer will need to be rotated 360 degrees in at least two directions in order to find the hard iron offset of the triple-axis magnetometer (which is referred to herein as a "FIG. 8" calibration algorithm) and is shown being performed by the portable calibration device 140 that serves a proxy for the magnetometer in the AP. The offsets are measured and then a calibration algorithm is invoked to generate a suitable correction factor. The compensation parameters (e.g., hard iron offsets and/or soft-iron offsets or scaling factors) are estimated based on the magnetic field measurements. After the subtraction of the measured offsets, the corrected compass heading can be calculated using conventional means (e.g., three axis transformation/arctangent method).

As shown in plot 350 of FIG. 3E and further described below with reference to FIGS. 4 and 5, estimating the hard-iron and soft-iron compensation parameters may involve (i) determining a set of hard-iron offsets from the collected magnetic field measurements (e.g., magnetometer measurements 342, 344, 346), and performing a sphere fitting calibration algorithm to apply a hard-iron correction factor to the collected magnetic field measurements by subtracting the set of hard-iron offsets with respect to each of the three axes to correct for the hard-iron distortion within proximity to the mounting location; and (ii) determining a set of soft-iron scale factors from the collected magnetic field measurements, and performing an ellipsoid fitting calibration algorithm to apply a soft-iron correction factor to the collected magnetic measurements by multiplying the set of soft-iron scale factors with respect to each of the three axes to correct for the soft-iron distortion within proximity to the mounting location.

In another example embodiment, estimating the hard-iron and soft-iron compensation parameters may involve (i) applying a hard-iron (e.g., sphere fitting) calibration algorithm to the collected magnetic field measurements (e.g., magnetometer measurements 342, 344, 346) and outputting a first radius corresponding to a hard-iron error coefficient to compensate for hard-iron distortion within proximity to the mounting location, and (ii) applying a soft-iron (e.g., ellipsoid fitting) calibration algorithm to the collected magnetic field measurements and outputting a second radius corresponding to a soft-iron error coefficient to compensate for soft-iron distortion within proximity to the mounting location.

In the case of an AP/antenna combination device located indoors or outdoors, it may be desirable to correct/calibrate the magnetometer readings, which, with an accelerometer (e.g., an XYZ accelerometer), may give accurate and useful information on the orientation and direction of the AP/antenna. This information, especially direction, is useful for network provisioning, 3D RF visualization/heatmaps, and checking the work of installers in large public venues (LPVs) such as stadiums or arenas. However, this solution has remained elusive and is prone to errors using existing technologies and methods.

Figure 4:
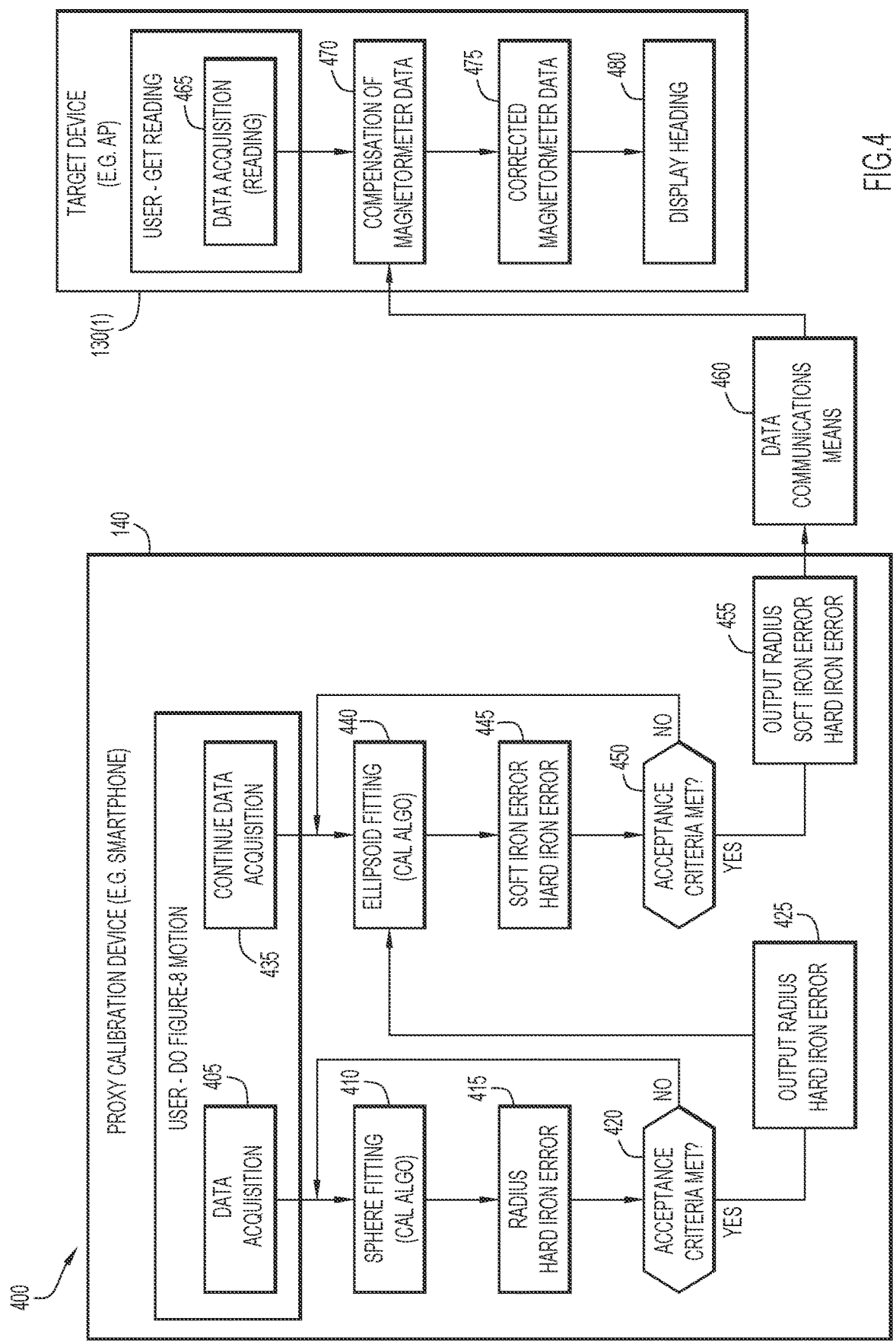
FIG. 4 is a flow chart showing an example implementation of magnetometer calibration process for devices hosting a 3D magnetometer, according to an example embodiment.

FIG. 4 is a flow chart of a magnetometer calibration process 400 for devices hosting a 3D magnetometer, according to an example embodiment. The computations performed based on the magnetic field measurements made by the portable calibration device may use one of several now known or hereinafter developed algorithms. Examples of known algorithms include TWOSTEP, Crassidis, Dorveaux, Vasconcelos, Ali, Wu and Shi, etc. In the process 400, the magnetic field measurements and computation of the calibration parameters are performed on the same device, e.g., on the portable calibration device 140, as opposed to the portable calibration device 140 sending the magnetic field measurements to another device, e.g., network controller 110, for computation of the calibration parameters. This is a variation to the method depicted in FIGS. 2A-2E. Reference is also made to FIG. 1 for purposes of the description of FIG. 4.

Process 400 begins with data acquisition, at step 405, while the user (installer) performs a particular movement (figure-8 motion) with the portable calibration device 140 at a mounting location where the target device (e.g., AP 130(1)) is to be installed for operation. This results in obtaining magnetic field measurements with the magnetometer of the portable calibration device 140. A sphere fitting calibration algorithm is then applied to the acquired magnetic field measurement data, at step 410. A radius (hard-iron error) is output, at step 415. A determination may then be made regarding whether acceptance criteria are met, at step 420. If the acceptance criteria are not satisfied ("No" at step 420), then the process loops back to repeat steps 405, 410, 415. If the acceptance criteria are satisfied ("Yes" at step 420), then the radius (hard-iron error) is output, at step 425. The acceptance criteria may involve repeating the figure-8 motion a certain number of times to ensure that a sufficient number of data points to determine the needed compensation parameters are collected. In some example embodiments, the acceptance criteria are that at least a minimum number of measurements with a minimum number of figure-8 motions, and the variance in the solution between those measurements is less than some threshold. This may serve to reduce any inaccuracies resulting from outlier magnetic field measurements, for example.

Process 400 also includes continuing the data acquisition, at step 435, while the user (installer) continues to perform the particular movement (figure-8 motion) with the portable calibration device 140 at the mounting location. This again results in obtaining magnetic field measurements with the magnetometer of the portable calibration device 140. An ellipsoid fitting calibration algorithm is then applied to the acquired magnetic field measurement data, at step 440, where the output radius (hard-iron error) from step 425 is used as input to the ellipsoid fitting calibration algorithm. A radius (hard-iron error and soft-iron error) is output, at step 445. A determination may then be made whether acceptance criteria are met, at step 450. If the acceptance criteria are not satisfied ("No" at step 450), then the method loops back to repeat steps 435, 440, 445. If the acceptance criteria are satisfied ("Yes" at step 450), the radius (hard-iron error and soft-iron error) will be output, at step 455. The acceptance criteria for step 450 may be the same or similar to the acceptance criteria for step 420 described above.

The output data may then be transmitted to the target device (e.g., AP 130(1), etc.), via a data communications means 460, to configure the target device with the output radius (hard-iron error and soft-iron error). Given the static nature of the magnetic fields, the data communications means 460 does not have to be real-time. Error coefficients may be stored by the portable calibration device 140 (e.g., smartphone) and delivered to the target device (e.g., AP 130(1), 130(2), etc.) by any common data communication means 460 such as wired network file transfer, hosting by network controller 110 (refer to FIGS. 1 and 2D-2E), local serial or wireless transfer, etc. without any time bounds.

Process 400 further includes another data acquisition, at step 465, to obtain a reading using the target device. This phase of the process results in obtaining magnetic field measurements with the magnetometer of the target device (e.g., AP 130(1), AP 130(2), etc.). Compensation of magnetometer data is then applied to the acquired magnetic field measurement data, at step 470, using the output radius (hard-iron error and soft-iron error) from step 455, received via data communications means 460, as input. Corrected magnetometer data is then output, at step 475. This corrected magnetometer data enables an accurate heading to be displayed, at step 480, using the corrected orientation. The computations referred to in steps 470 and 475 may employ any techniques now known or hereinafter developed to correct for magnetometer distortions, such as the aforementioned algorithms referred to above, e.g., TWOSTEP, Crassidis, Dorveaux, Vasconcelos, Ali, Wu and Shi, etc.

Thus, example embodiments described herein involve the introduction of a split (or "proxy") calibration system whereby a ubiquitous, manageable and portable calibration device 140 (e.g., smartphone) may be used to: (1) determine magnetic field distortion at a location; (2) calculate the local hard-iron and/or soft-iron error(s) (or "distortion") and compute calibration parameters to correct for the hard-iron and/or soft-iron distortions (or send the magnetic field measurements to a remote computing device (e.g., network controller) that computes the calibration parameters); and (3) transmit the calibration parameters for offset compensation to the target device (e.g., AP 130(1), 130(2), etc.) that will be installed for operation at this location. This is allowed by the linearity of the system which allows mathematical superposition, and the common architecture of the 3D magnetometers in both the portable calibration device (e.g., smartphone) and the target device (e.g., AP).

Any other potential requirement to transform the corrected data collected by the portable calibration device 140 before applying the compensation to the target device (AP) may be accomplished via the network controller 110 (or other remote computing device) involved in the data communications means 460. For example, adjustments could be made to the error coefficients generated by the portable calibration device 140 to account for different magnetometer responses in the target device (e.g., AP 130(1)) and the portable calibration device 140, and the adjusted error coefficients can then be provided to the target device to enable it to calibrate its magnetometer 138.

Figure 5:
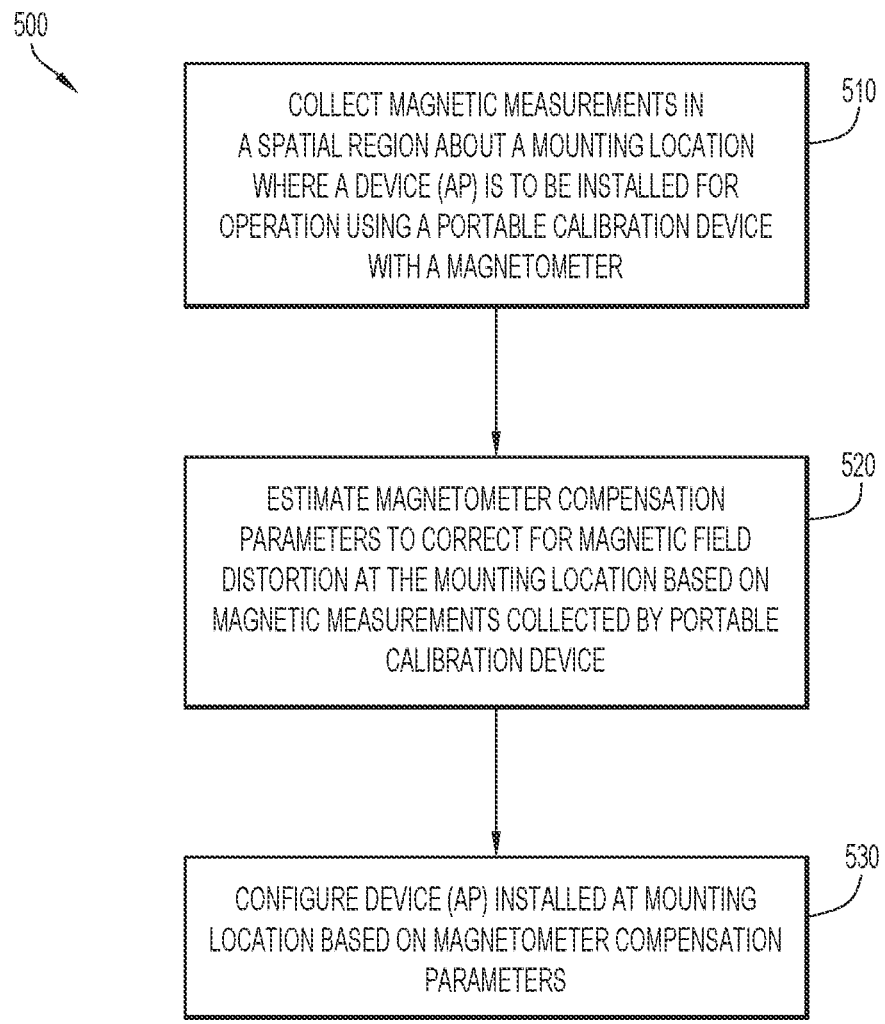
FIG. 5 is a flow chart showing an example method for calibrating a magnetometer of a target device via a portable calibration device and a network controller (e.g., a remote computing device), according to an example embodiment.

FIG. 5 is a flow chart showing an example process 500 for calibrating a magnetometer of a target device via a portable calibration device and a network controller, according to an example embodiment. For example, the portable calibration device may be a smartphone, the target device may be an access point, and the network controller may be a remote computing device, although example embodiments are not limited to these or any other specific devices.

At step 510, process 500 includes collecting magnetic field measurements, using a magnetometer of the portable calibration device, in a spatial region about a mounting location where the target device is to be installed for operation. This operation is performed while the portable calibration device is moved in a three-dimensional (3D) space about three axes (e.g., x, y, z) to cover a sphere of measurement at the mounting location where the target device is to be installed. In some example embodiments, process 500 may also include outputting a user instruction on the portable calibration device to perform a particular movement (e.g., in a "FIG. 8" motion) with the portable calibration device at the mounting location where the target device is to be installed.

At step 520, process 500 includes estimating magnetometer compensation parameters to correct for magnetic field distortion at the mounting location based on the magnetic field measurements collected by the portable calibration device. This operation may include estimating hard-iron magnetic field distortion and soft-iron magnetic field distortion caused by objects near the mounting location of the device. In some example embodiments, process 500 may also include sending the magnetic field measurements to a network controller, which performs the estimating operation. In one variation, this estimating operation may also include the network controller computing the magnetometer compensation parameters to account for any different responses of the magnetometer of the portable calibration device and the magnetometer of the target device.

At step 530, process 500 further includes configuring the target device installed at the mounting location based on the magnetometer compensation parameters. In some example embodiments, this operation may include sending, by the network controller via a network communication, the magnetometer compensation parameters to the target device.

In an example embodiment, the estimating operation of step 520 may include determining a set of hard-iron offsets from the collected magnetic field measurements, and performing a sphere fitting calibration algorithm to apply a hard-iron correction factor to the collected magnetic field measurements by subtracting the set of hard-iron offsets with respect to each of the three axes to correct for the hard-iron distortion within proximity to the mounting location. The estimating operation of step 520 may further include determining a set of soft-iron scale factors from the collected magnetic field measurements, and performing an ellipsoid fitting calibration algorithm to apply a soft-iron correction factor to the collected magnetic measurements by multiplying the set of soft-iron scale factors with respect to each of the three axes to correct for the soft-iron distortion within proximity to the mounting location. In this example embodiment, the configuring operation of step 530 may enable the target device to apply the hard-iron correction factor based on the hard-iron offsets, and apply the soft-iron correction factor based on the soft-iron scale factors, to compensate magnetometer data of the target device, such that the target device outputs corrected magnetometer data that compensates for the hard-iron distortion and the soft-iron distortion in proximity to the mounting location of the target device.

In another example embodiment, the estimating operation of step 520 may include applying a hard-iron (e.g., sphere fitting) calibration algorithm to the collected magnetic field measurements and outputting a first radius corresponding to a hard-iron error coefficient to compensate for hard-iron distortion within proximity to the mounting location, and applying a soft-iron (e.g., ellipsoid fitting) calibration algorithm to the collected magnetic field measurements and outputting a second radius corresponding to a soft-iron error coefficient to compensate for soft-iron distortion within proximity to the mounting location. In this example embodiment, the configuring operation of step 530 may include applying the first radius corresponding to the hard-iron error coefficient and the second radius corresponding to the soft-iron error coefficient to compensate magnetometer data of the target device, such that the target device outputs corrected magnetometer data that compensates for the hard-iron distortion and the soft-iron distortion in proximity to the mounting location of the target device.

In some example embodiments, the collecting, estimating, and configuring operations of process 500 are performed for each of a plurality of target devices, each having a magnetometer and each to be installed for operation at a respective mounting location. In this variation, process 500 may further include electronically reading, with the portable calibration device, identification information on each device of the plurality of target devices, in order to determine a unique identifier of each of the target devices against which the magnetic field measurements are associated. This operation can be used to correlate each target device with a respective calibration session.

In some example embodiments, the compensation parameters (e.g., calibration offsets, scale factors, coefficients, etc.) can be computed by the portable calibration device and transferred to the target device (e.g., AP) to enable the target device to configure its magnetometer with corresponding calibrations. In some other example embodiments, the portable calibration device transmits the magnetic measurements to a network controller, which performs the computation of the compensation parameters (e.g., calibration offsets, scale factors, coefficients, etc.) and transfers them to the target device.

In some example embodiments, the portable calibration device can calculate the local hard-iron and soft-iron errors (magnetic field distortion) at a specific mounting location on behalf of a large/bulky target device (e.g., AP), and this data can then be used for offset compensation by the target device when mounted at this specification location. In some other example embodiments, the portable calibration device communicates calibration data for each respective AP in a large public venue (e.g., stadium) to the network controller (e.g., remote computing device), and the network controller communicates with all of the respective APs in the large public venue to configure their respective magnetometers based on the corresponding calibration data.

In some example embodiments, once the target device is configured using the magnetometer compensation parameters, process 500 may further include predicting a wireless coverage area of the target device (e.g., wireless AP) based on the magnetometer compensation parameters. In some other example embodiments, process 500 may further include performing live directional adjustments of the target device (e.g., wireless AP) configured with the compensation parameters via a network connection to the network controller.

Thus, the magnetometer calibration processes 400, 500 allows each target device to understand how the beam of its antenna 132 is being deformed (the target device knows where the magnetic distortion is coming from and what the intensity is and location in 3D space in relation to the antenna 132 of the target device). This magnetometer calibration also enables each target device to determine its orientation (direction, tilt angle) and coverage area more accurately, despite the presence of magnetic field distortion in proximity to the mounting location of the target device. In some instances, this magnetometer calibration also allows each target device (e.g., (AP 130(1), AP 130(2), etc.) to adjust the radiation pattern of its antenna 132 (e.g., modify direction and/or change shape/width of beam field) in order to increase/improve coverage of its respective target area, if needed or desired.

Further, the magnetometer calibration processes 400, 500 allows the network controller 110 to understand how the beams of the antennas 132 of the target devices are being deformed (the network controller 110 knows where the magnetic distortions are coming from and what their intensities are and locations in 3D space in relation to each of the antennas of all of the target devices throughout the large public venue). This magnetometer calibration also enables the network controller 110 to determine the orientations (directions, tilt angles) and coverage areas of the target devices more accurately, despite the presence of magnetic field distortions in proximity to the mounting locations of the target devices. In some instances, this magnetometer calibration also allows the network controller 110 to control one or more target device(s) (e.g., AP 130(1), AP 130(2), etc.) to adjust the radiation pattern(s) of one or more antenna(s) 132 (e.g., modify direction and/or change shape/width of beam field) of the one or more target device(s) to increase/improve coverage of all respective target areas throughout the large public venue, if needed or desired.

According to various example embodiments described above with reference to FIGS. 1-5, a small handheld portable calibration device (e.g., a smartphone) containing a magnetic correction system can be used to perform magnetic correction at a location at which a large/bulky AP is about to be mounted (or is already mounted, in some instances). The coefficients generated by the magnetic correction system can then be provided to the target AP (and utilized to calibrate its magnetometer). This technique could be used to make installations and optimizations easier for large public venue installs (stadiums/arenas), in particular.

Figure 6:
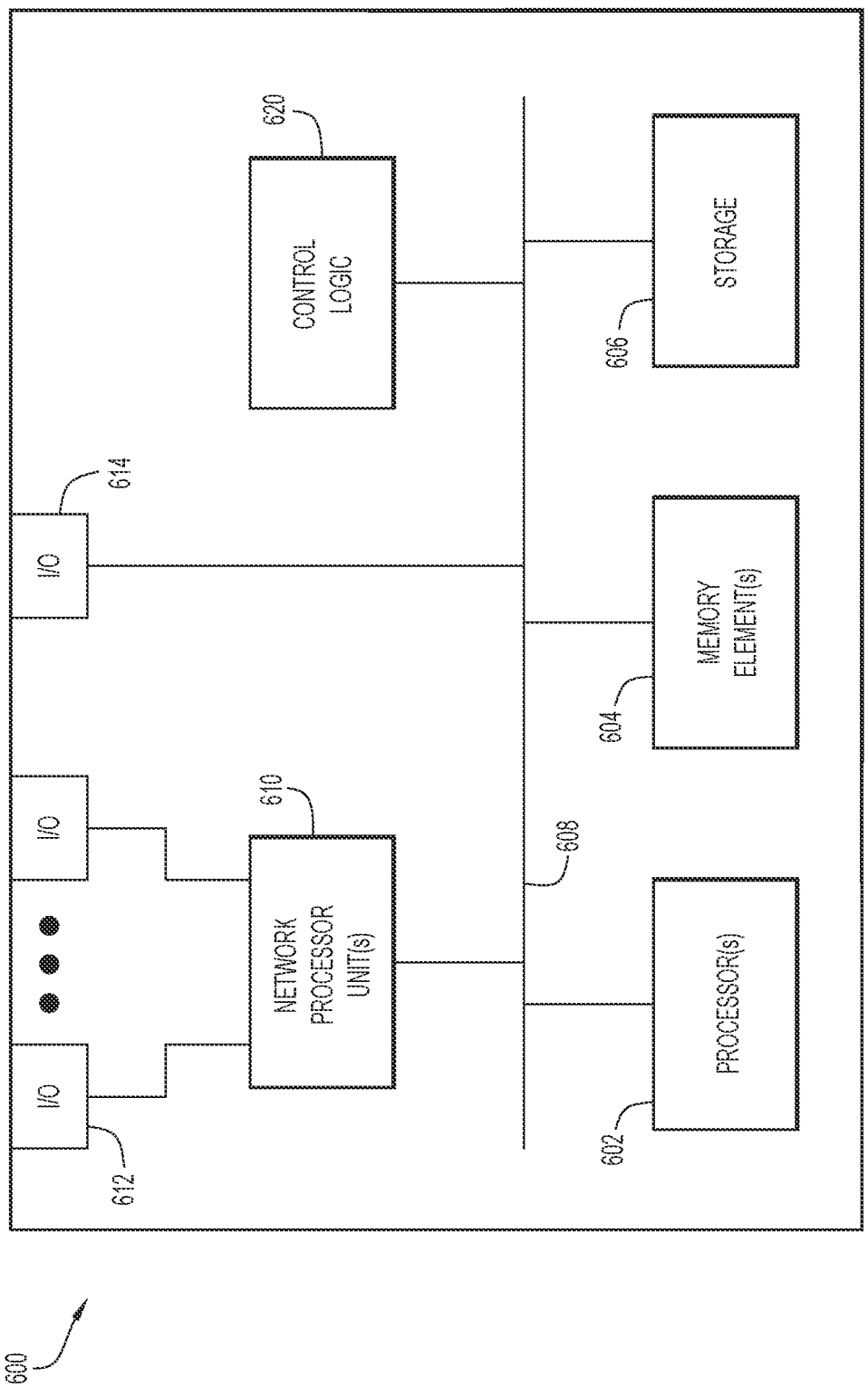
FIG. 6 is a block diagram of a computing device that may be used to implement the network controller of FIG. 1, according to an example embodiment.

Referring to FIG. 6, FIG. 6 illustrates a hardware block diagram of a computing device 600 that may perform functions associated with operations discussed herein in connection with the techniques depicted in FIGS. 1-5. In various embodiments, a computing device or apparatus, such as computing device 600 or any combination of computing devices 600, may be configured as any entity/entities as discussed for the techniques depicted in connection with FIGS. 1-5 in order to perform operations of the various techniques discussed herein. For example, a computing device 600 may be used to implement the wireless network controller 110 described above with reference to FIG. 1. Similarly, the portable calibration device 140 of FIG. 1 may correspond to a computing device 600 (e.g., a smartphone or other similar portable electronic device).

In at least one embodiment, the computing device 600 may be any apparatus that may include one or more processor(s) 602, one or more memory element(s) 604, storage 606, a bus 608, one or more network processor unit(s) 610 interconnected with one or more network input/output (I/O) interface(s) 612, one or more I/O interface(s) 614, and control logic 620. In various embodiments, instructions associated with logic for computing device 600 can overlap in any manner and are not limited to the specific allocation of instructions and/or operations described herein.

In at least one embodiment, processor(s) 602 is/are at least one hardware processor configured to execute various tasks, operations and/or functions for computing device 600 as described herein according to software and/or instructions configured for computing device 600. Processor(s) 602 (e.g., a hardware processor) can execute any type of instructions associated with data to achieve the operations detailed herein. In one example, processor(s) 602 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 604 and/or storage 606 is/are configured to store data, information, software, and/or instructions associated with computing device 600, and/or logic configured for memory element(s) 604 and/or storage 606. For example, any logic described herein (e.g., control logic 620) can, in various embodiments, be stored for computing device 600 using any combination of memory element(s) 604 and/or storage 606. Note that in some embodiments, storage 606 can be consolidated with memory element(s) 604 (or vice versa), or can overlap/exist in any other suitable manner.

In at least one embodiment, bus 608 can be configured as an interface that enables one or more elements of computing device 600 to communicate in order to exchange information and/or data. Bus 608 can be implemented with any architecture designed for passing control, data and/or information between processors, memory elements/storage, peripheral devices, and/or any other hardware and/or software components that may be configured for computing device 600. In at least one embodiment, bus 608 may be implemented as a fast kernel-hosted interconnect, potentially using shared memory between processes (e.g., logic), which can enable efficient communication paths between the processes.

In various embodiments, network processor unit(s) 610 may enable communication between computing device 600 and other systems, entities, etc., via network I/O interface(s) 612 (wired and/or wireless) to facilitate operations discussed for various embodiments described herein. In various embodiments, network processor unit(s) 610 can be configured as a combination of hardware and/or software, such as one or more Ethernet driver(s) and/or controller(s) or interface cards, Fibre Channel (e.g., optical) driver(s) and/or controller(s), wireless receivers/transmitters/transceivers, baseband processor(s)/modem(s), and/or other similar network interface driver(s) and/or controller(s) now known or hereafter developed to enable communications between computing device 600 and other systems, entities, etc. to facilitate operations for various embodiments described herein. In various embodiments, network I/O interface(s) 612 can be configured as one or more Ethernet port(s), Fibre Channel ports, any other I/O port(s), and/or antenna(s)/antenna array(s) now known or hereafter developed. Thus, the network processor unit(s) 610 and/or network I/O interface(s) 612 may include suitable interfaces for receiving, transmitting, and/or otherwise communicating data and/or information in a network environment.

I/O interface(s) 614 allow for input and output of data and/or information with other entities that may be connected to computing device 600. For example, I/O interface(s) 614 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 620 can include instructions that, when executed, cause processor(s) 602 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 620) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, any entity or apparatus as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 604 and/or storage 606 can store data, software, code, instructions (e.g., processor instructions), logic, parameters, combinations thereof, and/or the like used for operations described herein. This includes memory element(s) 604 and/or storage 606 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, any entity or apparatus for various embodiments described herein can encompass network elements (which can include virtualized network elements, functions, etc.) such as, for example, network appliances, forwarders, routers, servers, switches, gateways, bridges, loadbalancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the'(s)' nomenclature (e.g., one or more element(s)).

In some aspects, the techniques described herein relate to a method for calibrating a magnetometer of a device, the method including collecting, with a portable calibration device having a magnetometer, magnetic field measurements in a spatial region about a mounting location where the device is to be installed for operation, estimating magnetometer compensation parameters to correct for magnetic field distortion at the mounting location based on the magnetic field measurements collected by the portable calibration device, and configuring the device installed at the mounting location based on the magnetometer compensation parameters.

In some aspects, the techniques described herein relate to a method, wherein collecting the magnetic field measurements is performed while the portable calibration device is moved in a three-dimensional (3D) space about three axes to cover a sphere of measurement at the mounting location where the device is to be installed.

In some aspects, the techniques described herein relate to a method, further including outputting a user instruction on the portable calibration device to perform a particular movement in a "FIG. 8" motion at the mounting location where the device is to be installed.

In some aspects, the techniques described herein relate to a method, wherein estimating includes estimating hard-iron magnetic field distortion and soft-iron magnetic field distortion caused by objects near the mounting location of the device.

In some aspects, the techniques described herein relate to a method, further including sending the magnetic field measurements to a network controller, wherein estimating is performed by the network controller.

In some aspects, the techniques described herein relate to a method, wherein configuring includes the network controller sending, via a network communication, the magnetometer compensation parameters to the device.

In some aspects, the techniques described herein relate to a method, wherein collecting, estimating and configuring is performed for each of a plurality of devices each having a magnetometer and each of the plurality of devices to be installed for operation at a respective mounting location.

In some aspects, the techniques described herein relate to a method, further including electronically reading, with the portable calibration device, identification information on each device of the plurality of devices prior to collecting magnetic field measurements in order to determine a unique identifier of each of the plurality of devices against which the magnetic field measurements are associated.

In some aspects, the techniques described herein relate to a method, wherein the portable calibration device is a smartphone or other portable handheld electronic device, and wherein the device is a wireless access point (AP) having an integrated magnetometer and an external antenna.

In some aspects, the techniques described herein relate to a method, further including predicting a wireless coverage area of the wireless AP based on the magnetometer compensation parameters.

In some aspects, the techniques described herein relate to a method, further including performing live directional adjustments of the wireless AP, configured with the magnetometer compensation parameters via a network connection to a network controller.

In some aspects, the techniques described herein relate to a method, wherein estimating includes computing the magnetometer compensation parameters to account for any different responses of the magnetometer of the portable calibration device and the magnetometer of the device.

In some aspects, the techniques described herein relate to a system for calibrating a magnetometer of a target device, the system including a portable calibration device having a magnetometer that is configured to collect magnetic field measurements in a spatial region about a mounting location where the target device is to be installed for operation, and a remote computing device in communication with the portable calibration device and the target device, wherein at least one of the portable calibration device and/or the remote computing device is configured to estimate magnetometer compensation parameters to correct for magnetic field distortion at the mounting location based on the magnetic field measurements collected by the portable calibration device, and configure the target device installed at the mounting location based on the magnetometer compensation parameters.

In some aspects, the techniques described herein relate to a system, wherein the magnetometer of the portable calibration device is configured to collect the magnetic field measurements while the portable calibration device is moved in a three-dimensional space about three axes to cover a sphere of measurement at the mounting location where the target device is to be installed, and wherein the portable calibration device is further configured to output a user instruction to perform a particular movement at the mounting location where the target device is to be installed.

In some aspects, the techniques described herein relate to a system, wherein the at least one of the portable calibration device and/or the remote computing device is configured to estimate the magnetometer compensation parameters by estimating hard-iron magnetic field distortion and soft-iron magnetic field distortion caused by objects near the mounting location of the target device.

In some aspects, the techniques described herein relate to a system, wherein the portable calibration device is configured to estimate the magnetometer compensation parameters, and send the magnetometer compensation parameters to the remote computing device via a network communication, and wherein the remote computing device is configured to receive the magnetometer compensation parameters from the portable calibration device, and send the magnetometer compensation parameters to the target device via a network communication in order to configure the target device.

In some aspects, the techniques described herein relate to a system, wherein the portable calibration device is configured to send the magnetic field measurements to the remote computing device via a network communication, and wherein the remote computing device is configured to receive the magnetic field measurements from the portable calibration device, estimate the magnetometer compensation parameters, and configure the target device by sending the magnetometer compensation parameters to the target device via a network communication.

In some aspects, the techniques described herein relate to a non-transitory computer readable medium storing a program of instructions, which when executed by a processor of an electronic device, cause the electronic device to perform operations for calibrating a magnetometer of a target device, including obtaining magnetic field measurements in a spatial region about a mounting location where the target device is to be installed for operation, estimating magnetometer compensation parameters to correct for magnetic field distortion at the mounting location based on the magnetic field measurements, and configuring the target device installed at the mounting location based on the magnetometer compensation parameters.

In some aspects, the techniques described herein relate to a computer readable medium, wherein the electronic device is a portable calibration device having a magnetometer, wherein the instructions when executed by the processor of the portable calibration device cause the portable calibration device to perform operations including collecting the magnetic field measurements in the spatial region about the mounting location for the target device using the magnetometer of the portable calibration device, and sending the magnetometer compensation parameters to the target device, or to a network controller, via a network communication to configure the target device.

In some aspects, the techniques described herein relate to a computer readable medium, wherein the electronic device is a network controller in communication with a portable calibration device having a magnetometer and the target device, wherein the instructions when executed by the processor of the network controller cause the network controller to perform operations including receiving the magnetic field measurements from the portable calibration device via a network communication, and sending the magnetometer compensation parameters to the target device via a network communication to configure the target device.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A method for calibrating a magnetometer of a device, the method comprising:
    collecting, with a hand-held portable calibration device having a magnetometer, magnetic field measurements in a spatial region about a mounting location where the device is to be installed for operation, wherein collecting the magnetic field measurements is performed while hand-held portable calibration device is moved in a three-dimensional (3D) space about three axes to cover a sphere of measurement at the mounting location where the device is to be installed;
    estimating magnetometer compensation parameters to correct for magnetic field distortion at the mounting location based on the magnetic field measurements collected by the hand-held portable calibration device; and
    configuring the device installed at the mounting location based on the magnetometer compensation parameters.

2. The method of claim 1, further comprising outputting a user instruction on the hand-held portable calibration device to perform a particular movement in a "FIG. 8" motion at the mounting location where the device is to be installed.

3. The method of claim 1, wherein estimating comprises estimating hard-iron magnetic field distortion and soft-iron magnetic field distortion caused by objects near the mounting location of the device.

4. The method of claim 1, further comprising:
    sending the magnetic field measurements to a network controller,
    wherein estimating is performed by the network controller.

5. The method of claim 4, wherein configuring includes the network controller sending, via a network communication, the magnetometer compensation parameters to the device.

6. The method of claim 5, wherein collecting, estimating and configuring is performed for each of a plurality of devices each having a magnetometer and each of the plurality of devices to be installed for operation at a respective mounting location.

7. The method of claim 6, further comprising:
    electronically reading, with the hand-held portable calibration device, identification information on each device of the plurality of devices prior to collecting magnetic field measurements in order to determine a unique identifier of each of the plurality of devices against which the magnetic field measurements are associated.

8. The method of claim 1, wherein the portable calibration device is a smartphone or other portable handheld electronic device, and wherein the device is a wireless access point (AP) having an integrated magnetometer and an external antenna.

9. The method of claim 8, further comprising:
    predicting a wireless coverage area of the wireless AP based on the magnetometer compensation parameters.

10. The method of claim 8, further comprising:
    performing live directional adjustments of the wireless AP, configured with the magnetometer compensation parameters via a network connection to a network controller.

11. The method of claim 1, wherein estimating comprises computing the magnetometer compensation parameters to account for any different responses of the magnetometer of the hand-held portable calibration device and the magnetometer of the device.

12. A system for calibrating a magnetometer of a target device, the system comprising:
    a hand-held portable calibration device having a magnetometer that is configured to collect magnetic field measurements in a spatial region about a mounting location where the target device is to be installed for operation, wherein the hand-held portable calibration device is configured to collect the magnetic field measurements it is moved in a three-dimensional (3D) space about three axes to cover a sphere of measurement at the mounting location where the device is to be installed; and a remote computing device in communication with the portable calibration device and the target device, wherein at least one of the hand-held portable calibration device and/or the remote computing device is configured to:

estimate magnetometer compensation parameters to correct for magnetic field distortion at the mounting location based on the magnetic field measurements collected by the hand-held portable calibration device, and configure the target device installed at the mounting location based on the magnetometer compensation parameters.

13. The system of claim 12, wherein the portable calibration device is further configured to output a user instruction to perform a particular movement at the mounting location where the target device is to be installed.

14. The system of claim 12, wherein the at least one of the hand-held portable calibration device and/or the remote computing device is configured to estimate the magnetometer compensation parameters by estimating hard-iron magnetic field distortion and soft-iron magnetic field distortion caused by objects near the mounting location of the target device.

15. The system of claim 12, wherein the hand-held portable calibration device is configured to estimate the magnetometer compensation parameters, and send the magnetometer compensation parameters to the remote computing device via a network communication, wherein the remote computing device is configured to receive the magnetometer compensation parameters from the hand-held portable calibration device, and send the magnetometer compensation parameters to the target device via a network communication in order to configure the target device.

16. The system of claim 12, wherein the hand-held portable calibration device is configured to send the magnetic field measurements to the remote computing device via a network communication, wherein the remote computing device is configured to receive the magnetic field measurements from the hand-held portable calibration device, estimate the magnetometer compensation parameters, and configure the target device by sending the magnetometer compensation parameters to the target device via a network communication.

17. A non-transitory computer readable medium storing a program of instructions, which when executed by a processor of an electronic device, cause the electronic device to perform operations for calibrating a magnetometer of a target device, comprising:

obtaining, with a hand-held portable calibration device having a magnetometer, magnetic field measurements in a spatial region about a mounting location where the target device is to be installed for operation, the magnetic field measurements being obtained as the hand-held portable calibration device is moved in a three dimensional (3D) space about three axes to cover a sphere of measurement at the mounting location where the device is to be installed;

estimating magnetometer compensation parameters to correct for magnetic field distortion at the mounting location based on the magnetic field measurements; and configuring the target device installed at the mounting location based on the magnetometer compensation parameters.

18. The non-transitory computer readable medium according to claim 17, wherein the instructions when executed by the processor of the hand-held portable calibration device cause the hand-held portable calibration device to perform operations comprising:

sending the magnetometer compensation parameters to the target device, or to a network controller, via a network communication to configure the target device.

19. The non-transitory computer readable medium according to claim 17, wherein the electronic device is a network controller in communication with a—the hand-held portable calibration device and the target device, wherein the instructions when executed by the processor of the network controller cause the network controller to perform operations comprising:

receiving the magnetic field measurements from the hand-held portable calibration device via a network communication; and sending the magnetometer compensation parameters to the target device via a network communication to configure the target device.

20. The system of claim 12, wherein magnetic field measurements are collected by the hand-held portable calibration device for a plurality of target devices each having a magnetometer and each of which is to be installed for operation at a respective mounting location.

21. The system of claim 20, wherein the hand-held portable calibration device is configured to electronically read identification information on each target device of the plurality of target devices prior to collecting magnetic field measurements in order to determine a unique identifier of each of the plurality of target devices against which the magnetic field measurements are associated.

22. The system of claim 12, wherein the target device is a wireless access point (AP) having an integrated magnetometer, and wherein the hand-held portable calibration device or the remote computing device is configured to predict a wireless coverage area of the wireless AP based on the magnetometer compensation parameters.

* * * * *

UNITED STATES PATENT AND TRADEMARK OFFICE
CERTIFICATE OF CORRECTION

PATENT NO. : 12,019,126 B2
APPLICATION NO. : 17/977282
DATED : June 25, 2024
INVENTOR(S) : Fred Jay Anderson et al.

Page 1 of 1

It is certified that error appears in the above-identified patent and that said Letters Patent is hereby corrected as shown below:

In the Claims

Claim 2, Column 20, Line 8, please replace "FIG. 8" with --"figure 8"--

Claim 19, Column 22, Line 24, please replace "a—the" with --the--

Signed and Sealed this
Twenty-second Day of October, 2024

Katherine Kelly Vidal
*Director of the United States Patent and Trademark Office*